(12) United States Patent
Tawara et al.

(10) Patent No.: US 11,296,192 B2
(45) Date of Patent: Apr. 5, 2022

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventors: Takeshi Tawara, Tsukuba (JP); Mina Ohse, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 163 days.

(21) Appl. No.: 16/661,482

(22) Filed: Oct. 23, 2019

(65) Prior Publication Data

US 2020/0144371 A1 May 7, 2020

(30) Foreign Application Priority Data

Nov. 6, 2018 (JP) .............................. JP2018-209294

(51) Int. Cl.
| | |
|---|---|
| *H01L 29/16* | (2006.01) |
| *H01L 29/20* | (2006.01) |
| *H01L 21/04* | (2006.01) |
| *H01L 29/868* | (2006.01) |

(52) U.S. Cl.
CPC ........ *H01L 29/1608* (2013.01); *H01L 21/046* (2013.01); *H01L 29/2003* (2013.01); *H01L 29/868* (2013.01)

(58) Field of Classification Search
None
See application file for complete search history.

(56) References Cited

U.S. PATENT DOCUMENTS

| | | | | |
|---|---|---|---|---|
| 2009/0078936 | A1 | 3/2009 | Fujii | |
| 2014/0048847 | A1* | 2/2014 | Yamashita | .............. H01L 29/36 257/140 |
| 2018/0337275 | A1* | 11/2018 | Shimizu | .............. H01L 29/0878 |
| 2019/0040545 | A1* | 2/2019 | Nakamura | .......... H01L 29/7813 |
| 2019/0221664 | A1* | 7/2019 | Arai | ....................... H02M 3/155 |

FOREIGN PATENT DOCUMENTS

| | | |
|---|---|---|
| JP | 2005-276953 A | 10/2005 |
| JP | 2009-076642 A | 4/2009 |

* cited by examiner

*Primary Examiner* — Michelle Mandala
(74) *Attorney, Agent, or Firm* — Rabin & Berdo, P.C.

(57) ABSTRACT

A silicon carbide semiconductor device includes, sequentially, a first semiconductor layer of a first conductivity type, a second semiconductor layer of the first conductivity type provided on the first semiconductor layer, a third semiconductor layer of the first conductivity type provided on the second semiconductor layer, and a fourth semiconductor layer of a second conductivity type provided on the third semiconductor layer. A first electrode is provided on the first semiconductor layer, and a second electrode is provided on the fourth semiconductor layer. An impurity concentration of the second semiconductor layer is higher than that of the first semiconductor layer, and an impurity concentration of the third semiconductor layer is lower than that of the second semiconductor layer. The first semiconductor layer also contains, at a surface thereof in contact with the second semiconductor layer, a second impurity different from a first impurity that determines a conductivity type of the first semiconductor layer.

7 Claims, 4 Drawing Sheets

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2018-209294, filed on Nov. 6, 2018, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Conventionally, single crystal silicon has been used as a material for power semiconductor devices that control high voltage and large current. There are various types of power semiconductor devices and each is selectively used according to intended purpose. For example, P-intrinsic-N diodes (PiN diodes) and bipolar transistors as well as insulated gate bipolar transistors (IGBTs) are so-called bipolar devices. Of these devices, those handling high current density cannot switch at high speeds. Bipolar transistors have a frequency application limit of several kHz while IGBTs have an application limit of about 20 kHz. On the other hand, while large current cannot be handled, power metal oxide semiconductor field effect transistors (MOSFETs) may be used at high speeds up to several MHz. Nonetheless, market demand for power devices equipped to handle both high current and high speeds is strong and much effort has been poured into the improvement of silicon IGBTs and power MOSFETs, to the point that at present, the performance of power devices has substantially reached the theoretical limit determined by the silicon material.

Moreover, verification of power semiconductor devices from a view point of material has also be performed and recently, next generation power semiconductor devices using silicon carbide (SiC) have particularly gained attention because these devices have low ON voltage as well as high speed and high temperature characteristics and because SiC is chemically a very stable material, has a wide bandgap of 3 eV, and may be used very stably as a semiconductor even at high temperatures. Further, critical field strength is also ten or more times larger than that of silicon. SiC has a high possibility of exceeding material limits of silicon and therefore, further growth is expected for power semiconductor applications. In particular, for super high voltage applications such as pulsed power and power exceeding 10 kV, expectations are high with respect to PiN diodes that are bipolar devices.

A structure of a conventional silicon carbide semiconductor device will be described taking a PiN diode as an example. FIG. 7 is a cross-sectional view of the structure of the conventional silicon carbide semiconductor device. The PiN diode depicted in FIG. 7 has a P-layer-i-layer-N-layer structure, configured using an epitaxial base in which an n-type silicon carbide layer 102 forming an i-layer and a p-type silicon carbide layer 103 forming a P-layer are sequentially stacked by epitaxial growth on a front surface of an $n^+$-type silicon carbide substrate 101 forming an N-layer. Further, the p-type silicon carbide layer 103 may be formed by ion implantation. An anode electrode 105 is provided at a surface of the p-type silicon carbide layer 103 and a cathode electrode 106 is provided at a rear surface of the $n^+$-type silicon carbide substrate 101.

During forward energization of the PiN diode, holes (positive holes) 1011 generated at a pn interface occur, pass through the layers of silicon carbide, and move toward the cathode electrode 106 as indicated by arrow 10A in FIG. 7. At this time, when hole density at an interface between the $n^+$-type silicon carbide substrate 101 and the n-type silicon carbide layer 102 exceeds a predetermined value and recombination occurs on basal plane dislocations (BPDs) present in the $n^+$-type silicon carbide substrate 101, and a stacking fault 1012 that causes forward voltage (Vf) degradation expands from the interface between the $n^+$-type silicon carbide substrate 101 and the n-type silicon carbide layer 102.

Thus, there is a technique of providing a short-lifetime layer 104 of minority carriers between the $n^+$-type silicon carbide substrate 101 and the n-type silicon carbide layer 102. FIG. 8 is a cross-sectional view of the conventional silicon carbide semiconductor device including the short-lifetime layer. The short-lifetime layer 104 known to be a silicon carbide epitaxial layer (hereinafter, high-concentration nitrogen layer) doped with, for example, nitrogen (N) at a high concentration, or a silicon carbide epitaxial layer (hereinafter, co-doped layer) to which a different element such as boron (B), vanadium (V), titanium (Ti), iron (Fe), chromium (Cr) is concurrently added (co-doped) with nitrogen. The short-lifetime layer 104 is provided, whereby as depicted by arrow 10B in FIG. 8, the holes generated at the pn interface recombine at the short-lifetime layer 104 and are prevented from reaching the $n^+$-type silicon carbide substrate 101, enabling expansion of the stacking fault 1012 from the $n^+$-type silicon carbide substrate 101 to be prevented.

As a technique of preventing expansion of stacking faults, for example, there is a technique in which in a PiN diode, in a region near a pn junction where a concentration of carriers injected during a forward bias state is relatively high or in a region near an n+n junction, a poly-silicon film is formed as a predetermined film having crystal defects that become recombination centers (for example, refer to Japanese Laid-Open Patent Publication No. 2009-076642). Further, according to another technique a silicon carbide (SiC) first layer is of an n-type or a p-type conductivity type, a second layer of a conductivity type different from that of the first layer is on the first layer, an impurity is irradiated in the first layer or the second layer, defects are introduced into the first layer or the second layer, and the defects function as carrier recombination centers (for example, refer to Japanese Laid-Open Patent Publication No. 2005-276953).

SUMMARY OF THE INVENTION

According to an embodiment of the invention, a silicon carbide semiconductor device includes a first semiconductor layer of a first conductivity type, having a first side and a second side opposite to each other; a second semiconductor layer of the first conductivity type, provided on the first semiconductor layer, and having a first side and a second side opposite to each other, the second side of the second semiconductor layer facing the first side of the first semiconductor layer, the second semiconductor layer having an impurity concentration higher than that of the first semiconductor layer; a third semiconductor layer of the first conductivity type, provided on the first side of the second semiconductor layer, and having a first side and a second side opposite to each other, the second side of the third semiconductor layer facing the first side of the second semiconductor layer, the third semiconductor layer having an impurity concentration lower than that of the second semiconductor layer; a fourth semiconductor layer of a second conductivity type, provided on the first side of the third semiconductor layer, and having a first side and a second side opposite to each other, the second side of the fourth semiconductor layer facing the first side of the third semiconductor layer; a first electrode provided on the second side of the first semiconductor layer; and a second electrode provided on the first side of the fourth semiconductor layer. The first semiconductor layer contains, at a surface thereof in contact with the second semiconductor layer, a second impurity different from a first impurity that determines a conductivity type of the first semiconductor layer.

In the embodiment, the second semiconductor layer is a layer controlling carrier lifetime.

In the embodiment, the second semiconductor layer contains nitrogen as an impurity thereof, the impurity concentration of the second semiconductor layer being in a range from $1 \times 10^{18}$ to $2 \times 10^{19}/cm^3$.

In the embodiment, the second semiconductor layer contains, at a surface thereof in contact with the first semiconductor layer, the second impurity.

In the embodiment, the first impurity is nitrogen, and the second impurity is vanadium, titanium, iron, chromium or boron.

According to another embodiment of the invention, a method of manufacturing a silicon carbide semiconductor device includes providing a first semiconductor layer of a first conductivity type that has a first side and a second side opposite to each other, the first semiconductor layer containing a first impurity that determines a conductivity type thereof; ion implanting, at a surface of the first semiconductor layer, a second impurity that is of a type different from that of the first impurity; forming, on the surface of the first semiconductor layer, a second semiconductor layer of the first conductivity type, the second semiconductor layer having a first side and a second side opposite to each other, the second side of the second semiconductor layer facing the first side of the first semiconductor layer, an impurity concentration of the second semiconductor layer being higher than that of the first semiconductor layer; forming a third semiconductor layer of the first conductivity type on the first side of the second semiconductor layer, the third semiconductor layer having a first side and a second side opposite to each other, the second side of the third semiconductor layer facing the first side of the second semiconductor layer, an impurity concentration of the third semiconductor layer being lower than that of the second semiconductor layer; forming a fourth semiconductor layer of a second conductivity type on the first side of the third semiconductor layer, the fourth semiconductor layer having a first side and a second side opposite to each other, the second side of the fourth semiconductor layer facing the first side of the third semiconductor layer; forming a first electrode on the second side of the first semiconductor layer; and forming a second electrode on the first side of the fourth semiconductor layer.

In the embodiment, the first impurity is nitrogen. The second impurity is vanadium, titanium, iron, chromium or boron. A dose amount of ion implantation of the second impurity is in a range from $1 \times 10^{16}$ to $1 \times 10^{20}/cm^3$, and an implantation depth of the second impurity is at least 0.3 μm.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques will be discussed. Forming the high-concentration nitrogen layer to have a uniform impurity concentration and a uniform film thickness is difficult. Furthermore, when the nitrogen concentration is too high at $2 \times 10^{19}/cm^3$ or higher, double Shockley stacking faults (DSFs) occur. Therefore, there is a limit to suppressing the occurrence of Shockley stacking faults due to the high-concentration nitrogen layer.

Further, in the co-doped layer, after the formation of the co-doped layer, the different co-doped element may remain in a reactor (hereinafter, epi-growth reactor) of epitaxial growth equipment and management of impurities in the epi-growth reactor is difficult. This becomes particularly problematic when in the same epi-growth reactor, a drift layer of a long-lifetime such as the n-type silicon carbide layer 102 is formed successively after a buffer layer of a short-lifetime like the short-lifetime layer 104. Further, at the co-doped layer, ensuring in-plane uniformity in the co-doped layer may be difficult by doping controllability of the different element.

Figure 8:
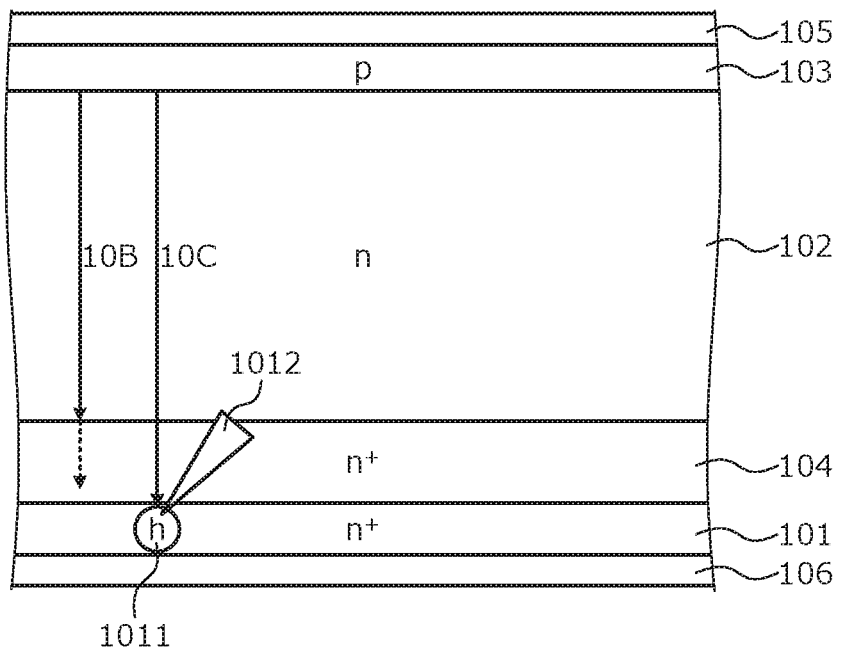
FIG. 8 is a cross-sectional view of the conventional silicon carbide semiconductor device including a short-lifetime layer.

Furthermore, even when the short-lifetime layer 104 is provided, if forward current increases exceeding the hole recombination capability of the short-lifetime layer 104, as indicated by arrow 10C in FIG. 8, arrival of holes to the n$^+$-type silicon carbide substrate 101 occurs. Thus, when the current is further increased, the stacking fault 1012 from a dislocation of a deep portion of the n$^+$-type silicon carbide substrate 101 expand, degrading performance of the PiN diode.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

Figure 1:
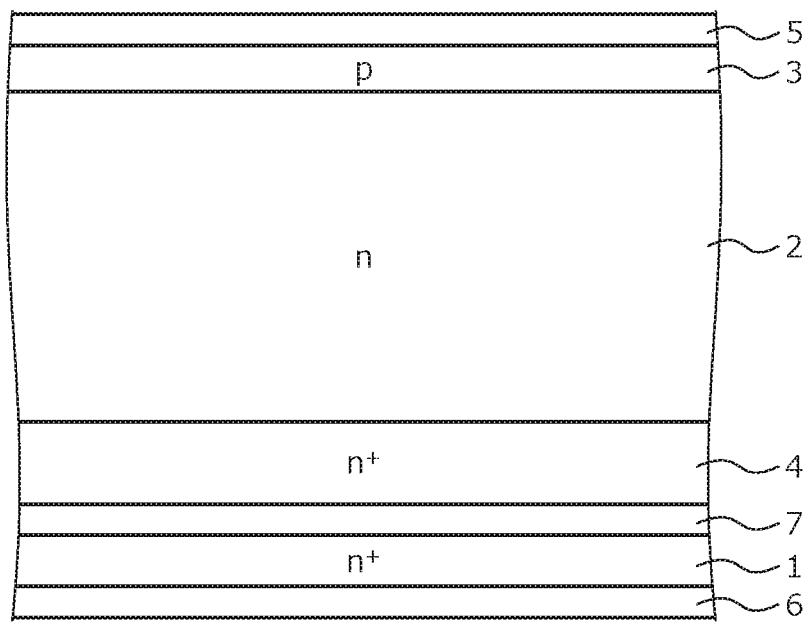
FIG. 1 is a cross-sectional view of a structure of a silicon carbide semiconductor device according to an embodiment.

As a silicon carbide semiconductor device according to the present invention, a silicon carbide PiN diode will be described as an example. FIG. 1 is a cross-sectional view of a structure of a silicon carbide semiconductor device according to an embodiment.

As depicted in FIG. 1, the silicon carbide semiconductor device is configured using a silicon carbide base in which at a front surface of an $n^+$-type silicon carbide substrate (first semiconductor layer of a first conductivity type) 1, a short-lifetime layer (second semiconductor layer of the first conductivity type) 4, an n-type silicon carbide layer (third semiconductor layer of the first conductivity type) 2, and a p-type silicon carbide layer (fourth semiconductor layer of a second conductivity type) 3 are sequentially stacked.

The $n^+$-type silicon carbide substrate 1 is a silicon carbide single crystal substrate doped with, for example, nitrogen. A substrate surface layer 7 of the $n^+$-type silicon carbide substrate 1 contains an impurity (hereinafter, different-type impurity) different from an impurity, e.g., nitrogen, that determines the conductivity type of the $n^+$-type silicon carbide substrate 1, the substrate surface layer 7 being at an interface of the $n^+$-type silicon carbide substrate 1 and in contact with the short-lifetime layer 4. The substrate surface layer 7 is provided to a depth at least 0.3 μm from a surface of the $n^+$-type silicon carbide substrate 1. The different-type impurity, for example, may be implanted in the substrate surface layer 7 by ion implantation. A lifetime killer may be introduced as the different-type impurity. At least one type, for example, B, V, Ti, Fe, Cr, etc. is introduced as the lifetime killer.

The different-type impurity is included in the substrate surface layer 7, thereby enabling recombination centers to be created near basal plane dislocations near the surface of the $n^+$-type silicon carbide substrate 1. As a result, when current exceeding the capability of the short-lifetime layer 4 is applied and holes reach relatively deep portions from the surface of the $n^+$-type silicon carbide substrate 1, the holes are trapped and recombined at the different-type impurity, thereby enabling an occurrence probability of stacking faults from the $n^+$-type silicon carbide substrate 1 to be reduced.

The short-lifetime layer 4 is provided at a front surface of the $n^+$-type silicon carbide substrate 1 and is formed by epitaxial growth. The short-lifetime layer 4 is a layer that controls a lifetime of positive holes of the holes, and is a silicon carbide epitaxial layer doped with a high concentration of N, for example, in a range from $1\times10^{18}$ to $2\times10^{19}/cm^3$ or a silicon carbide epitaxial layer in which a different element such as B, V, Ti, Fe, Cr, etc. is added (co-doped) with nitrogen.

Figure 2:
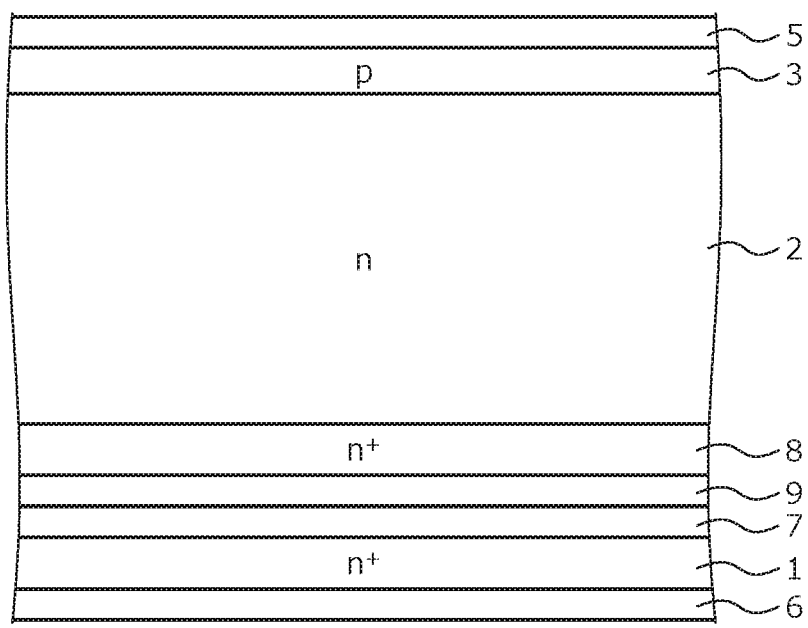
FIG. 2 is a cross-sectional view of the structure in a case where a short-lifetime layer of the silicon carbide semiconductor device according to the embodiment is a high-nitrogen-density layer.

Here, FIG. 2 is a cross-sectional view of the structure in a case where the short-lifetime layer of the silicon carbide semiconductor device according to the embodiment is a high-nitrogen-density layer. When the short-lifetime layer 4 is a high-nitrogen-density layer 8 and a different element is implanted in the $n^+$-type silicon carbide substrate 1 at a high density, for example, in a range from $1\times10^{16}$ to $1\times10^{20}/cm^3$, during layer deposition of the short-lifetime layer 4, auto-doping occurs (impurities that come out when the $n^+$-type silicon carbide substrate 1 is etched are incorporated in the short-lifetime layer 4, which is an epitaxial film), forming a co-doped layer 9 at an interface between the short-lifetime layer 4 and the $n^+$-type silicon carbide substrate 1. Formation of the co-doped layer 9 enables reduction of the holes reaching the surface of the $n^+$-type silicon carbide substrate 1, even when current exceeding the capability of the short-lifetime layer 4 is applied.

The n-type silicon carbide layer 2 is, for example, a drift layer doped with nitrogen at an impurity concentration lower than impurity concentrations of the $n^+$-type silicon carbide substrate 1 and the short-lifetime layer 4. Further, the p-type silicon carbide layer 3 is provided on the n-type silicon carbide layer 2, a cathode electrode (first electrode) 6 is provided at a rear surface of the $n^+$-type silicon carbide substrate 1, and an anode electrode (second electrode) 5 is provided at a surface of the p-type silicon carbide layer 3.

Figure 3:
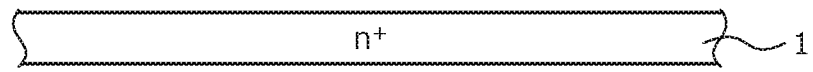
FIG. 3 is a cross-sectional view of the silicon carbide semiconductor device according to the embodiment during manufacture.
Figure 4:
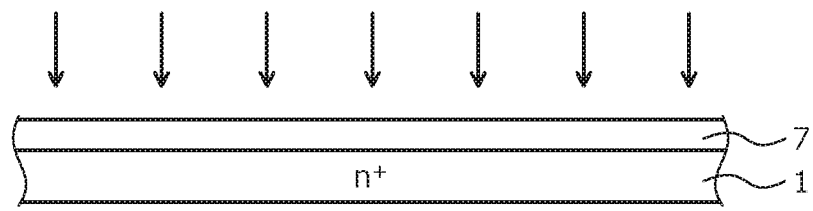
FIG. 4 is a cross-sectional view of the silicon carbide semiconductor device according to the embodiment during manufacture.
Figure 5:
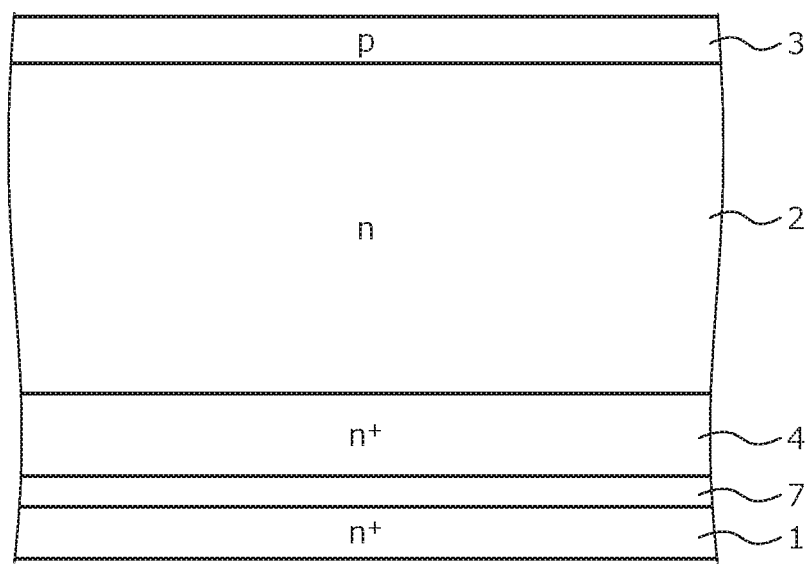
FIG. 5 is a cross-sectional view of the silicon carbide semiconductor device according to the embodiment during manufacture.

A method of manufacturing the silicon carbide semiconductor device according to the embodiment will be described taking, as an example, a case in which silicon carbide is used as a semiconductor material and a PiN diode is fabricated (manufactured). FIGS. 3, 4, and 5 are cross-sectional views of the silicon carbide semiconductor device according to the embodiment during manufacture.

First, as depicted in FIG. 3, the $n^+$-type silicon carbide substrate 1 is prepared. Next, on the surface of the $n^+$-type silicon carbide substrate 1, the substrate surface layer 7 is formed by ion implanting the different-type impurity such as V, Ti, Fe, Cr, or B, etc. In the ion implantation here, for example, a dose amount is in a range from $1\times10^{16}$ to $1\times10^{20}/cm^3$ and an implantation depth of the different-type impurity is at least 0.3 μm. The state up to here is depicted in FIG. 4.

Next, on the substrate surface layer 7, a silicon carbide epitaxial layer that forms the short-lifetime layer 4 is deposited while nitrogen, which is an n-type impurity, is doped. Further, the short-lifetime layer 4 may be a deposited silicon carbide epitaxial layer in which in addition to nitrogen of an impurity concentration equal to or higher than the impurity concentration of the $n^+$-type silicon carbide substrate 1, an element that is a lifetime killer, for example, B is concurrently added (co-doped).

Next, on the short-lifetime layer 4, the n-type silicon carbide layer 2 is deposited by epitaxial growth. Next, on the n-type silicon carbide layer 2, the p-type silicon carbide layer 3 is deposited by epitaxial growth. Here, the p-type silicon carbide layer 3 may be formed at a surface of the n-type silicon carbide layer 2 by ion implantation of a p-type impurity. Next, activation annealing (heat treatment) for activating each diffusion region formed by ion implantation is performed. The state up to here is depicted in FIG. 5.

Next, for example, aluminum (Al) is deposited on a surface of the p-type silicon carbide layer 3, thereby forming the anode electrode 5. Next, for example, nickel (Ni) is deposited on the rear surface of the $n^+$-type silicon carbide substrate 1 and a heat treatment is performed, thereby forming the cathode electrode 6. In this manner, a vertical PiN diode depicted in FIG. 1 is completed.

As described above, according to the embodiment, in the silicon carbide semiconductor device, the different-type impurity is included in the substrate surface layer of the $n^+$-type silicon carbide substrate. As a result, when current exceeding the capability of the short-lifetime layer is applied and holes reach a relatively deep portion from the surface of the n$^+$-type silicon carbide substrate, the holes may be trapped and recombined at the different-type impurity. Therefore, the occurrence probability of stacking faults from the n$^+$-type silicon carbide substrate may be reduced, and ON resistance and forward voltage (Vf) of the silicon carbide semiconductor device increase, enabling degradation of performance of the silicon carbide semiconductor device to be prevented.

Further, the high-nitrogen-density layer may be provided as the short-lifetime layer. As a result, the co-doped layer may be formed in the high-nitrogen-density layer at the interface thereof with the n$^+$-type silicon carbide substrate. Even when current exceeding the capability of the short-lifetime layer is applied, holes reaching the surface of the n$^+$-type silicon carbide substrate may be reduced by the co-doped layer.

Figure 6:
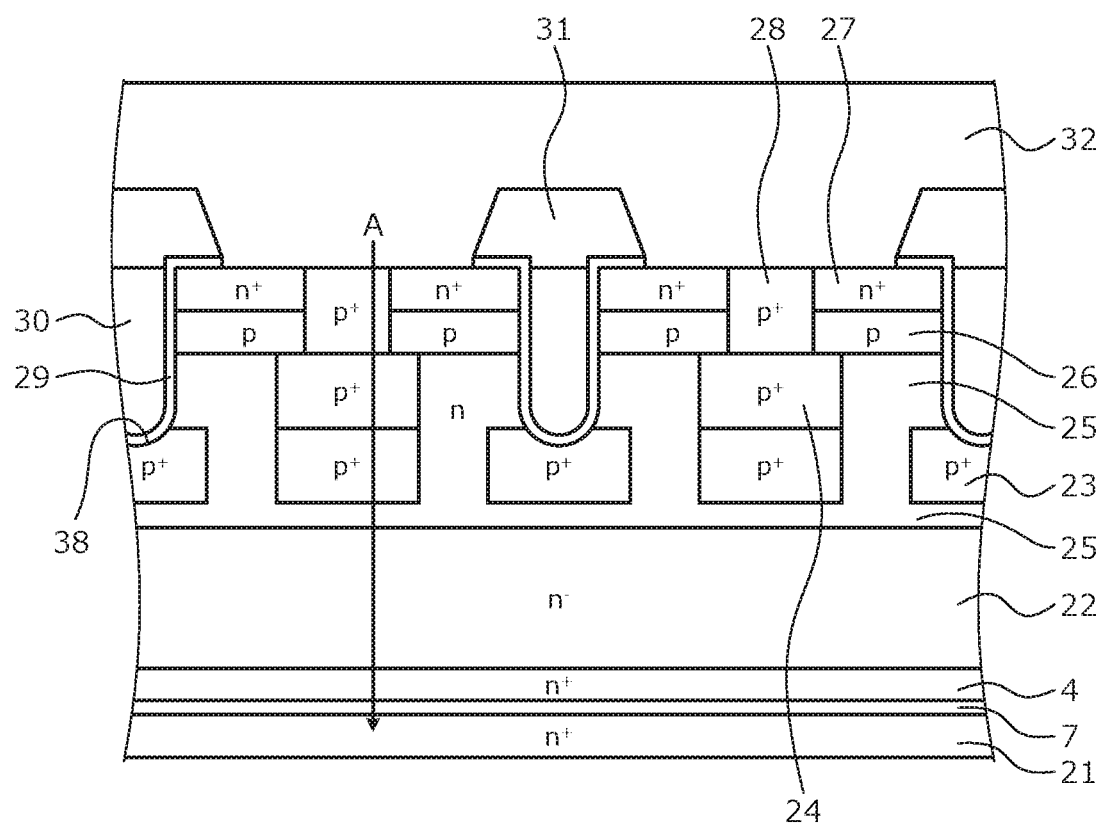
FIG. 6 is a cross-sectional view of a structure of a trench-type silicon carbide MOSFET.
Figure 7:
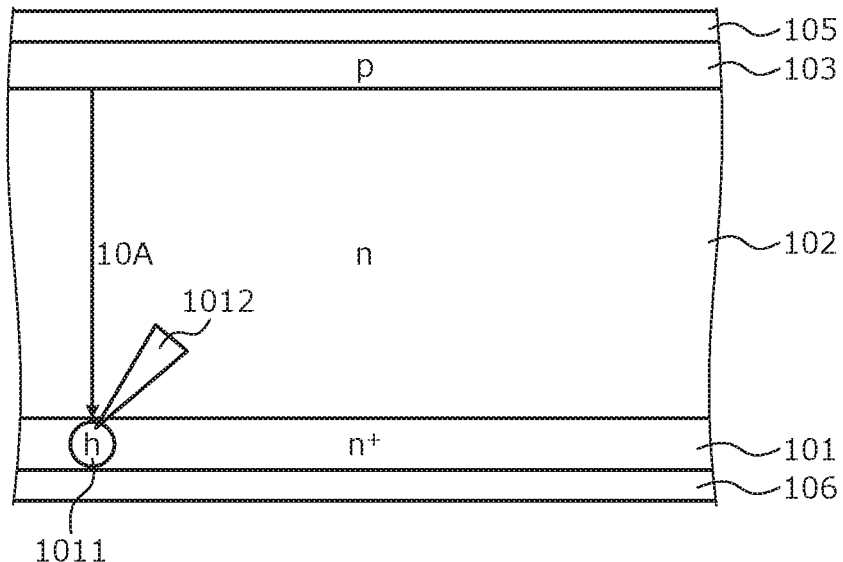
FIG. 7 is a cross-sectional view of a structure of a conventional silicon carbide semiconductor device.

In the embodiment described above, while description is given taking a PiN diode as an example, the present invention is further applicable to built-in diodes of silicon carbide MOSFETs. FIG. 6 is a cross-sectional view of a structure of a trench-type silicon carbide MOSFET.

In FIG. 6, reference numerals 21, 22, 23, 24, 25, 26, 27, 28, 29, 30, 31, 32, and 38 are an n$^+$-type silicon carbide substrate, an n$^-$-type drift layer, a first p$^+$-type region, a second p$^+$-type region, an n-type region, a p-type base layer, an n$^+$-type source region, a p$^+$-type contact region, a gate insulating film, a gate electrode, an interlayer insulating film, a source electrode, and a trench, respectively. In such a vertical MOSFET having such a trench gate structure, a built-in diode (parasitic pn diode) formed by the p-type base layer 26 and the n$^-$-type drift layer 22 as a body diode between a source and a drain is built-in.

In the MOSFET, other than a mode (synchronous rectification mode) during which current flows in a MOS channel, a mode (bipolar mode) during which current flows through the built-in diode as indicated by arrow A in FIG. 6 also exists. Similarly to the case of the PiN diode, during the bipolar mode, when hole density of an interface between the n$^+$-type silicon carbide substrate 21 and the n$^-$-type drift layer 22 exceeds a predetermined value, recombination occurs centered on basal plane dislocations present in the n$^+$-type silicon carbide substrate 21. By this recombination, stacking faults that cause forward voltage (Vf) degradation at the interface between the n$^+$-type silicon carbide substrate 21 and the n$^-$-type drift layer 22 expand.

Therefore, similarly to the embodiment, the short-lifetime layer 4 of minority carriers is provided between the n$^+$-type silicon carbide substrate 21 and the n$^-$-type drift layer 22, and an impurity different from an impurity, e.g., nitrogen, that determines the conductivity type of the n$^+$-type silicon carbide substrate 21 may be included in the substrate surface layer 7 of the n$^+$-type silicon carbide substrate 21. As a result, similarly to the case of the PiN diode, in the MOSFET as well, the occurrence of stacking faults in the n$^+$-type silicon carbide substrate 21 are suppressed and performance degradation may be suppressed.

In the foregoing, various modifications within a range not departing from the spirit of the invention are possible. In the embodiments, for example, dimensions, impurity concentrations, etc. of regions may be variously set according to necessary specifications. Further, in the embodiments, while the first conductivity type is a p-type and a second conductivity type is an n-type, the present invention is similarly implemented when the first conductivity type is an n-type and the second conductivity type is a p-type.

According to the invention described above, in the silicon carbide semiconductor device, the different-type impurity is included in the substrate surface layer of the n$^+$-type silicon carbide substrate (first semiconductor layer of the first conductivity type). As a result, when current that exceeds the capability of the short-lifetime layer (second semiconductor layer of the first conductivity type) is applied and holes reach a relatively deep position from the surface of the n$^+$-type silicon carbide substrate, the holes may be trapped and recombined at the different-type impurity. Therefore, the occurrence probability of stacking faults from the n$^+$-type silicon carbide substrate may be reduced, and the ON resistance and forward voltage (Vf) of the silicon carbide semiconductor device increase, enabling degradation of performance of the silicon carbide semiconductor device to be prevented.

Further, the high-nitrogen-density layer may be provided as the short-lifetime layer. As a result, the co-doped layer may be formed in the high-nitrogen-density layer at the interface thereof with the n$^+$-type silicon carbide substrate. Even when current that exceeds the capability of the short-lifetime layer is applied, holes that reach the surface of the n$^+$-type silicon carbide substrate may be reduced by the co-doped layer.

The silicon carbide semiconductor device and the method of manufacturing a silicon carbide semiconductor device according to the present invention achieve an effect in that occurrence of stacking faults in the silicon carbide semiconductor substrate are suppressed and performance degradation may be suppressed.

As described, the silicon carbide semiconductor device and the method of manufacturing a silicon carbide semiconductor device according to the invention are useful for power semiconductor devices used in power converting equipment such as inverters and in power supply devices such as in various industrial machines as well as in igniters for automobiles.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device comprising:
a first semiconductor layer containing a first impurity, causing the first semiconductor layer to be of a first conductivity type, the first semiconductor layer having a first side and a second side opposite to each other;
a second semiconductor layer of the first conductivity type, provided on the first semiconductor layer, and having a first side and a second side opposite to each other, the second side of the second semiconductor layer facing the first side of the first semiconductor layer, the second semiconductor layer having an impurity concentration higher than that of the first semiconductor layer;
a third semiconductor layer of the first conductivity type, provided on the first side of the second semiconductor layer, and having a first side and a second side opposite to each other, the second side of the third semiconductor layer facing the first side of the second semiconductor layer, the third semiconductor layer having an impurity concentration lower than that of the second semiconductor layer;
a fourth semiconductor layer of a second conductivity type, provided on the first side of the third semiconductor layer, and having a first side and a second side opposite to each other, the second side of the fourth semiconductor layer facing the first side of the third semiconductor layer;

a first electrode provided on the second side of the first semiconductor layer; and a second electrode provided on the first side of the fourth semiconductor layer, wherein the first semiconductor layer further contains, at a surface thereof in contact with the second semiconductor layer, in addition to the first impurity, a second impurity that has an impurity type different from that of the first impurity.

2. The silicon carbide semiconductor device according to claim 1, wherein the second semiconductor layer is a layer controlling carrier lifetime.

3. The silicon carbide semiconductor device according to claim 1, wherein the second semiconductor layer contains nitrogen as an impurity thereof, the impurity concentration of the second semiconductor layer being in a range from $1\times10^{18}$ to $2\times10^{19}$/cm$^3$.

4. The silicon carbide semiconductor device according to claim 3, wherein the second semiconductor layer contains, at a surface thereof in contact with the first semiconductor layer, the second impurity.

5. The silicon carbide semiconductor device according to claim 1, wherein the first impurity is nitrogen, and the second impurity is vanadium, titanium, iron, chromium or boron.

6. A method of manufacturing a silicon carbide semiconductor device, the method comprising:

providing a first semiconductor layer of a first conductivity type that has a first side and a second side opposite to each other, the first semiconductor layer containing a first impurity that determines a conductivity type thereof;

ion implanting, at a surface of the first semiconductor layer, a second impurity that is of a type different from that of the first impurity, such that the surface contains both the first impurity and the second impurity;

forming, on the surface of the first semiconductor layer, a second semiconductor layer of the first conductivity type, the second semiconductor layer having a first side and a second side opposite to each other, the second side of the second semiconductor layer facing the first side of the first semiconductor layer, an impurity concentration of the second semiconductor layer being higher than that of the first semiconductor layer;

forming a third semiconductor layer of the first conductivity type on the first side of the second semiconductor layer, the third semiconductor layer having a first side and a second side opposite to each other, the second side of the third semiconductor layer facing the first side of the second semiconductor layer, an impurity concentration of the third semiconductor layer being lower than that of the second semiconductor layer;

forming a fourth semiconductor layer of a second conductivity type on the first side of the third semiconductor layer, the fourth semiconductor layer having a first side and a second side opposite to each other, the second side of the fourth semiconductor layer facing the first side of the third semiconductor layer;

forming a first electrode on the second side of the first semiconductor layer; and forming a second electrode on the first side of the fourth semiconductor layer.

7. The method according to claim 6, wherein the first impurity is nitrogen, the second impurity is vanadium, titanium, iron, chromium or boron, and a dose amount of ion implantation of the second impurity is in a range from $1\times10^{16}$ to $1\times10^{20}$/cm$^3$, and an implantation depth of the second impurity is at least 0.3 µm.

* * * * *